United States Patent [19]

Kikkawa

[11] Patent Number: 5,345,108
[45] Date of Patent: Sep. 6, 1994

[54] SEMICONDUCTOR DEVICE HAVING MULTI-LAYER ELECTRODE WIRING

[75] Inventor: Takamaro Kikkawa, Tokyo, Japan

[73] Assignee: NEC Corporation, Tokyo, Japan

[21] Appl. No.: 840,925

[22] Filed: Feb. 25, 1992

[30] Foreign Application Priority Data

Feb. 26, 1991 [JP] Japan .................................. 5-3931

[51] Int. Cl.⁵ ................... H01L 23/48; H01L 29/46; H01L 29/54; H01L 29/62
[52] U.S. Cl. ................................ 257/751; 257/736; 257/750; 257/758; 257/760; 257/761; 257/762; 257/763; 257/764; 257/765
[58] Field of Search ................... 357/71; 257/736, 750, 257/751, 758, 760, 761, 762, 763, 764, 765

[56] References Cited

U.S. PATENT DOCUMENTS

| | | | |
|---|---|---|---|
| 4,017,890 | 4/1977 | Howard et al. | 357/67 |
| 4,381,595 | 5/1983 | Denda et al. | 29/589 |
| 4,673,623 | 6/1987 | Gardner et al. | 428/620 |
| 4,872,050 | 10/1989 | Okamoto et al. | 357/71 |
| 4,960,489 | 10/1990 | Roeska et al. | 156/652 |

OTHER PUBLICATIONS

Gniewek et al., "Titanium Overlay on Metallurgy", IBM Technical Disclosure Bulletin, vol. 13, No. 5, Oct 1970.
Ting et al., "The Use of Titanium-Based Contact Barrier layers in S Technology", Electronics and Optics, Thin Solid films, 96 pp. 327-345 Apr. 5-8 1982.
Olowalafe et al., "Interaction of Cu with CoSi₂ with and without TiNx barrier layers", Appl. Phys. Lett., vol. 57 No. 13, Sep. 24, 1990.

*Primary Examiner*—Sara W. Crane
*Assistant Examiner*—Valencia M. Wallace
*Attorney, Agent, or Firm*—Burns, Doane, Swecker & Mathis

[57] ABSTRACT

A semiconductor device having an electrode wiring which prevents generation of hillock and has good stress migration capability is disclosed. A multi layer film including at least two Al-Si-Cu alloy films and at least two titanium nitride films formed by reactive sputtering laminated alternately with the Al-Si-Cu alloy films has a high mechanical strength against deformation and can effectively prevent generation of hillock. Ti-Al intermetallic compounds are formed in grain boundaries and in interfaces, which is effective to restrict generation of a void. Propagation of a void can be prevented by the intermediate titanium nitride film. Further, the formation of the Ti-Al compounds is restricted and an increase of resistance is negligible.

4 Claims, 3 Drawing Sheets

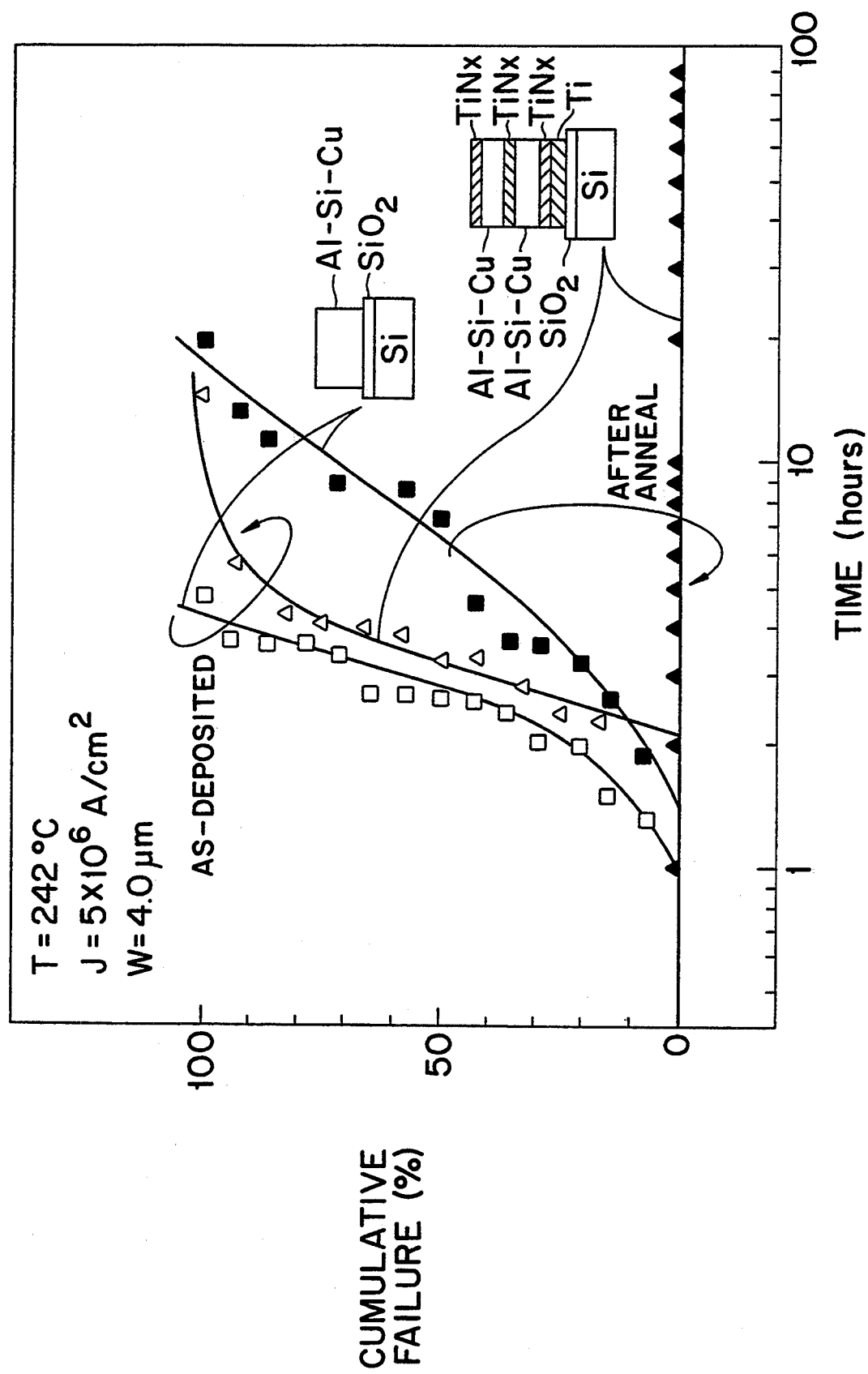

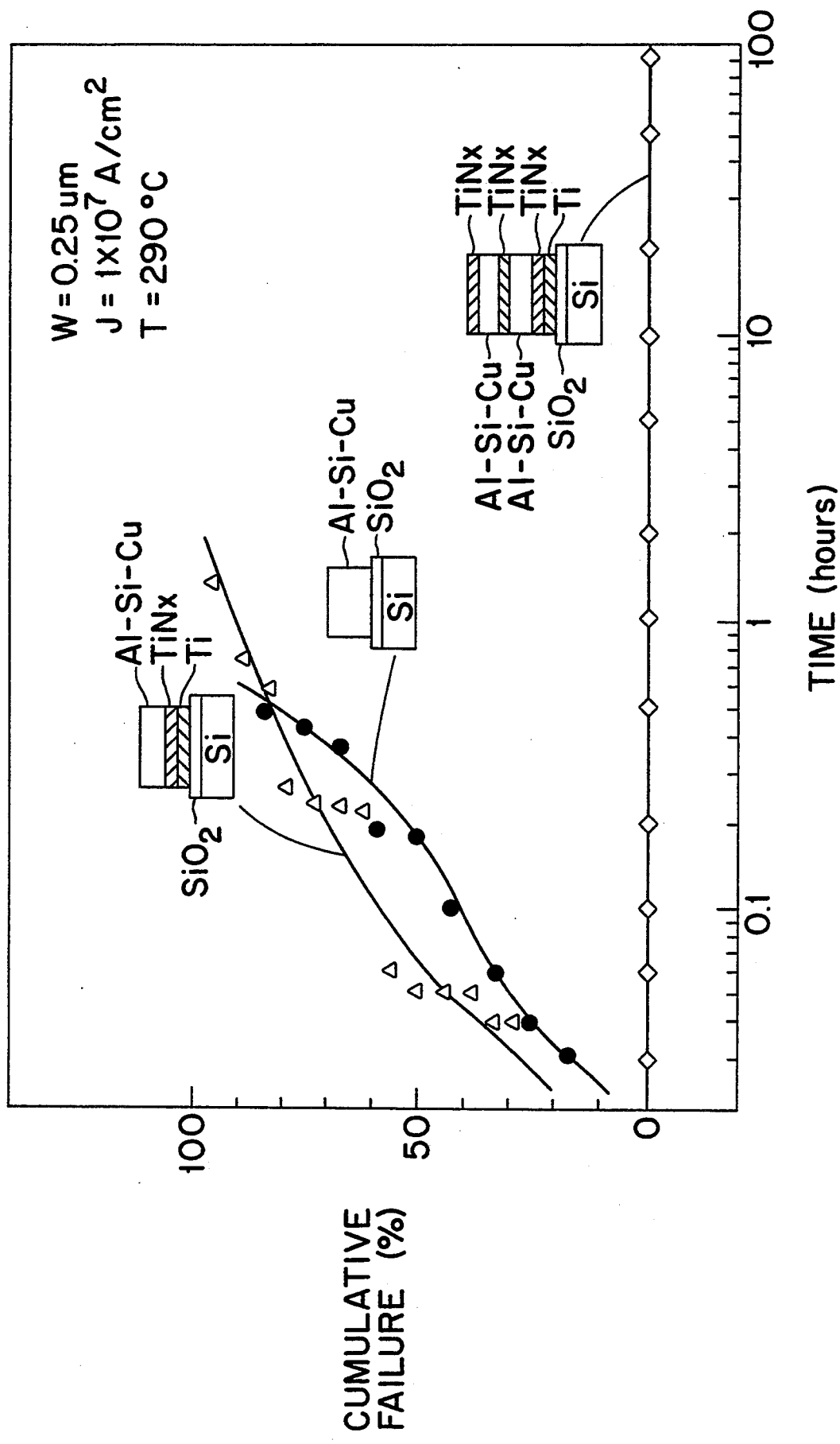

SEMICONDUCTOR DEVICE HAVING MULTI-LAYER ELECTRODE WIRING

BACKGROUND OF THE INVENTION

The present invention relates to a semiconductor device and a method of fabricating the same and, particularly, to an aluminum wiring to be used as electrode wiring of a semiconductor integrated circuit and a method of forming the same wiring.

It has been usual that a wiring of aluminum film is used as an electrode wiring of a semiconductor integrated circuit, in particular, a silicon large scale integrated circuit (Si-LSI), for reasons of high compatibility with aluminum to a silicon substrate, easiness of machining and good adhesion to a lower layer, etc.

With increase of integration density of semiconductor integrated circuit, density of current flowing through an electrode wiring increases, causing reliability problem of aluminum film wiring to come to surface. The problem may include reliability of contact to shallow junction, inter-wiring short-circuit due to hillocks and wiring breakage due to stress migration and/or electromigration.

The problem of contact reliability can be excluded by use of wiring of aluminum and silicon (Al-Si) alloy film and an insertion of a barrier film of such as titanium nitride (TiN) between an impurity diffusion layer and an aluminum film wiring for the purpose of preventing silicon diffusion from the diffusion layer to the aluminum film. However, when such titanium nitride film is covered by the aluminum film, grain size of aluminum of the latter may be reduced, degrading resistance thereof to electromigration.

Generation of hillock can be reduced by using, as wiring, a multi layer film composed of an alternative lamination of aluminum-silicon alloy films and titanium films, as disclosed in U.S. Pat. No. 4,673,623 issued on Jun. 16, 1987 to D. S. Gardner et al. and assigned to The Board of Trustees of the Leland Stanford Junior University. However, in Gardner et al., thickness of the titanium film contributes largely to properties of a resultant wiring such that, when thickness is reduced, possibility of hillock generation is increased, while, when it is increased, resistance thereof is increased. Therefore, in Gardner et al., there is a problem of reproducibility in fabrication and, in addition thereto, electromigration problem is not considered.

The resistivity of wiring to electromigration may be improved by using, as the wiring, a three layer film composed of a titanium film sandwiched by aluminum-copper (Al-Cu) alloy films, as disclosed in U.S. Pat. No. 4,017,890 issued on Apr. 12, 1977 to J. K. Howard et al. and assigned to International Business Machines Corporation. However, the problem of increased resistance caused by making the titanium film thick can not be avoided by Howard et al.

Stress migration is considered as being produced by deformation of wiring due to thermal stress exerted thereon. Further, it has been considered that an aluminum-silicon-copper (Al-Si-Cu) alloy film is resistant to stress migration.

Although, as mentioned, effective approaches for solving the individual problems have been made respectively, any approach by which all of these problems are solved simultaneously has not been developed as yet.

BRIEF SUMMARY OF THE INVENTION

Accordingly, a first object of the present invention is to provide a semiconductor device having electrode wiring which does hardly produce hillocks and exhibits high resistance to electromigration and stress migration and a method of fabricating the same.

A second object of the present invention is to provide a semiconductor device having an electrode wiring which can form a reliable contact to a shallow junction and which hardly produces hillocks and exhibits high resistance to electromigration and stress migration and a method of fabricating the same.

A semiconductor device according to an embodiment of the present invention includes an electrode wiring in the form of a multi layer film composed of at least two pairs of alternately laminated Al-Si-Cu alloy films and titanium nitride films. At grain boundaries of the Al-Si-Cu alloy film and at interfaces between the Al-Si-Cu alloy films and the titanium nitride films, titanium-aluminum (Ti-Al) intermetallic compounds are formed. Since mechanical hardness of the titanium nitride films is considerably high and the Al-Si-Cu alloy films are bonded to each other through the Ti-Al intermetallic compounds, the electrode wiring is hardly deformed mechanically, resulting in high resistance to stress migration. Furthermore, it is possible to prevent hillocks from being generated by forming the titanium nitride films using reactive sputtering at a temperature not higher than a thermoplastic deformation temperature of the Al-Si-Cu film and constituting an uppermost layer of the wiring with a titanium nitride film. Existence of Ti-Al intermetallic compounds prevents generation of voids in the Al-Si-Cu alloy films. Furthermore, since a titanium nitride film exists between adjacent Al-Si-Cu alloy films, propagation of a void between the adjacent Al-Si-Cu alloy films can be blocked. Therefore, breakage of electrode wiring due to transportation of aluminum is hardly to occur and, since resistance in the thickness direction of the titanium nitride film is small enough to maintain current path, it exhibits a high resistivity to electromigration. Furthermore, the amount of titanium in the titanium nitride film, which contributes to Al-Ti reaction, is small and, further, formation of Ti-Al intermetallic compounds is restricted by reaction between silicon and titanium. Accordingly, a low resistance electrode wiring can be obtained with high reproducibility.

By forming a double layer film of an upper titanium nitride film and a lower titanium film and then forming a multi layer film formed by alternate lamination of Al-Si-Cu alloy films and titanium films thereon, an electrode wiring which is compatible with an impurity diffusion layer of a silicon substrate can be obtained. In this case, it is considered that the stress migration resistance of the electrode wiring is further improved.

BRIEF DESCRIPTION OF THE DRAWINGS

The above-mentioned and other objects, features and advantages of the present invention will become more apparent by reference to the following detailed description of the present invention taken in conjunction with the accompanying drawings, wherein:

FIG. 2 is a graph showing electromigration resistance of a wiring having width W=4.0 μm, according to an embodiment of the present invention; and FIG. 3 is a graph showing electromigration resistance of a wiring having width W=0.25 μm, according to another embodiment of the present invention.

DETAILED DESCRIPTION OF THE PREFERRED EMBODIMENTS

An embodiment of the present invention will be described with reference to the fabrication steps thereof shown in FIGS. 1(a) to 1(d).

Figure 1A:
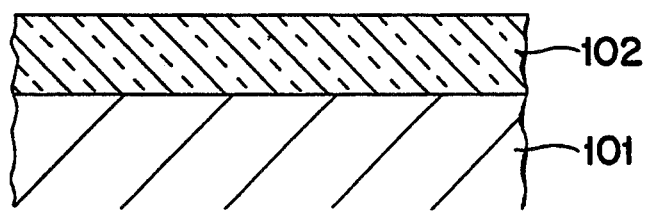
FIGS. 1(a) through 1(d) are cross sections of a semiconductor chip in respective main fabrication steps, according to an embodiment of the present invention.

As shown in FIG. 1(a), a silicon oxide film 102 about 1 μm thick is formed on a P type silicon substrate 101 whose specific resistance is 10 ohm-cm. In this embodiment, it is assumed that the silicon substrate 101 has been formed with a field oxide film and transistors and contact holes have been formed in an interlayer insulation film formed thereon.

Figure 1B:
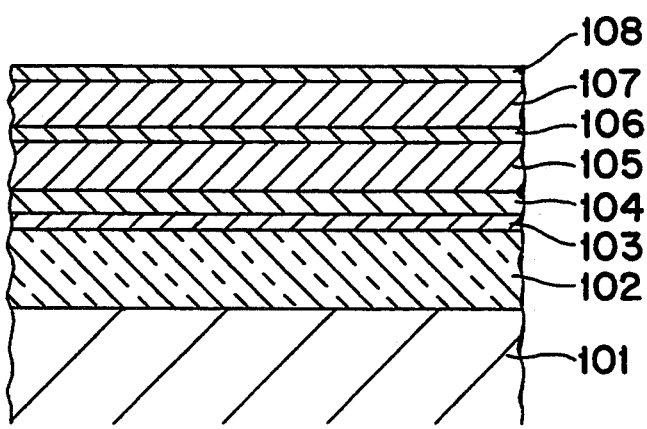

Then, as shown in FIG. 1(b), a titanium film 103 having thickness of 30 nm is deposited on the wafer shown in FIG. 1(a) by a DC magnetron sputtering device which uses a titanium plate as a target to which electric power of 0.4 kW is supplied in ambient argon gas at $8 \times 10^{-3}$ Torr, without heating the substrate. Then, a titanium nitride film 104 is deposited in a similar manner with using a titanium nitride plate as a target supplied with the same electric power in a 1:1 mixture gas of argon and nitrogen at $7 \times 10^{-3}$ Torr with heating of the substrate to 350° C. Then, an Al-1%Si-0.5%Cu alloy film 105 having a thickness of 200 nm is deposited using an Al-1%Si-0.5%Cu plate as a target under conditions of electric power of 7 kW, ambient argon gas at $6 \times 10^{-3}$ Torr while the substrate 101 is heated to a temperature from 300° C. to 400° C., preferably, to 350° C. It should be noted that, in this description, the percentage of respective constituents is in weight. After the substrate temperature is lowered to a temperature not higher than 300° C., preferably, to about 100° C., a titanium nitride film 106 having a thickness of 30 nm is formed on the film 105 by reactive sputtering with the same conditions as those used in the formation of the titanium nitride film 104 except the substrate temperature. The Al-1%Si-0.5%Cu alloy film 105 exhibits thermoplastic deformation at or higher than a certain temperature within a range from 200° C. to 300° C., which may cause hillocks to occur. Therefore, the formation of the titanium nitride film 106 should be performed at the substrate temperature of 200° C. at most. Then, an Al-1%Si-0.5Cu alloy film 107 having thickness of 200 nm is formed on the film 106 by sputtering. On the alloy film 107, a titanium nitride film 108 having thickness of 30 nm is formed by reactive sputtering with the same conditions as those used in the formation of the titanium nitride film 106.

The fabrication steps from the formation of the titanium film 103 to the formation of the titanium nitride film 108 are performed within the same DC magnetron sputtering device while maintaining vacuum pressure therein.

Figure 1C:
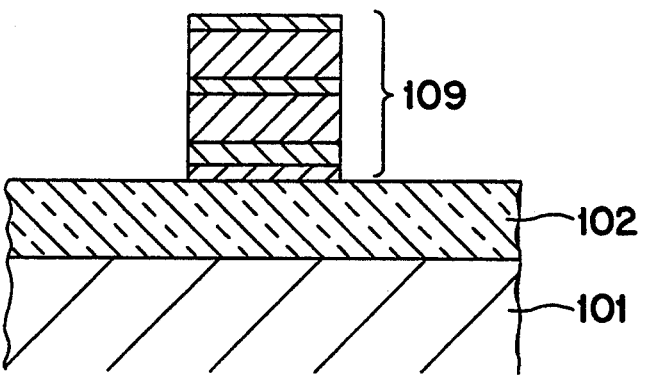

Then, as shown in FIG. 1(c), the lamination of the titanium film 103, the titanium nitride film 104, the Al-1%Si-0.5%Cu (referred to as Al-Si-Cu hereinafter) alloy film 105, the titanium nitride film 106, the Al-Si-Cu alloy film 107 and the titanium nitride film 108 in the order is patterned by using a photo resist film selectively formed thereon by photolithography or electron beam lithography as a mask and reactive ion-etched with chlorine gas, resulting in an electrode wiring 109. All of the titanium nitride films 104, 106 and 108 and the Al-Si-Cu alloy films 105 and 107 are reactive ion-etchable using chlorine gas.

The titanium nitride film 108 acts as an anti-reflection film during the photolithographic steps. For example, its reflectivity against i-line whose wavelength is 365 nm is about 20% and that of the Al-Si-Cu alloy film is 90% or more.

Then, the wafer is heat-treated at 450° C. for 30 minutes to improve contact between the electrode wiring and the silicon substrate.

Figure 1D:
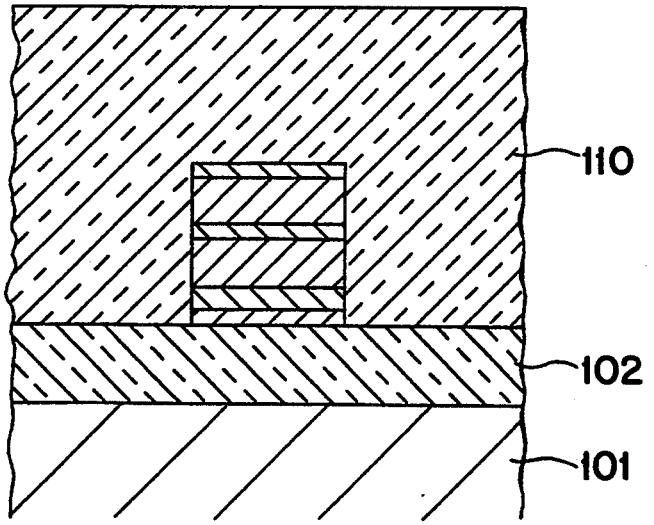

Then, as shown in FIG. 1(d), a silicon nitride film 110 having a thickness of 1 μm is formed by plasma CVD as a cover film.

In this embodiment, the titanium nitride films 104, 106 and 108 are formed by reactive sputtering, so that each of them contains stoichiometrically excessive titanium. In this connection, presense of Ti, $Ti_2N$ and TiN can be confirmed by X ray diffraction (XRD) analysis. When a titanium nitride film is utilized as a usual barrier film, it is put in air once and then heat-treated in nitrogen gas atmosphere. That is, in this embodiment, the formation of the multi layer film is performed in the DC magnetron sputtering device in which the same vacuum pressure is maintained throughout these steps, as mentioned previously. Therefore, in the sintering process for improving contact, excessive titanium in the titanium nitride films 104, 106 and 108 reacts with the Al-Si-Cu alloy film, resulting in Ti-Si compounds and Ti-Al intermetallic compounds. In this case, since Ti-Si compounds may be formed easier than Ti-Al intermetallic compounds, the formation of the latter is restricted by the formation of the former. Further, resistivity of Ti-Si intermetallic compounds is lower than that of Ti-Al intermetallic compounds. It is observed by XRD and transmission electron microscope that Ti-Al intermetallic compounds such as $TiAl_3$, $Ti_9Al_{23}$ or $Ti_8Al_{24}$ exist at the interfaces between the Al-Si-Cu alloy films and the titanium nitride films and grain boundaries of the Al-Si-Cu alloy films. Therefore, it can be considered that the Al-Si-Cu alloy film and the titanium nitride film are bonded together through the Ti-Al intermetallic compounds.

The double layer film of the titanium film 103 and the titanium nitride film 104 acts not only as a stress buffer between the Al-Si-Cu alloy film 105 and the underlying substrate which includes the p type silicon substrate 101 and the silicon oxide film 102 formed thereon but also as a diffusion barrier between the Al-Si-Cu alloy film and an impurity diffusion layer (not shown) formed selectively on a surface portion of the P type silicon substrate. The titanium film 103 reacts with silicon of the impurity diffusion layer to form a titanium silcide film by which contact resistance is reduced. It is not necessary to form the titanium nitride film 104/the titanium film 103 in a region of electrode wiring which is not in contact with the impurity diffusion layer of the silicon substrate, for example, an electrode wiring whose contact is made through tungsten burying openings provided in an insulating film.

The Al-Si-Cu alloy films 105 and 107 form the main current path of the electrode wiring. The titanium nitride film 106 formed therebetween prevents a void produced in either of the Al-Si-Cu alloy film 105 or 107 from propagating to the other. Further, the aforementioned Ti-Al intermetallic compounds prevent nucleation and growth of a void in the Al-Si-Cu alloy film. In order to confirm these facts, various comparative samples having variously formed wirings 0.25 μm and 4 μm wide, etc., were prepared and heat-treated at 500° C. for 30 minutes and the presence of a void was checked by optical microscope. Among the comparative samples, those having wirings each composed of a single Al-Si-Cu alloy film formed on a silicon substrate having silicon oxide film 102 formed thereon had voids of various size, regardless of the width of wiring. On the contrary, in the present chip, there was neither a void nor a hillock observed.

The titanium nitride film 108 constituting the uppermost layer of the electrode wiring of the present invention acts as a stress buffer and also functions to reduce diffused reflection during photolithography.

Hardness of TiN and $TiAl_3$ in Vickers are 100 times and 50 times larger than that of aluminum, respectively. Therefore, hardness of the electrode wiring according to this embodiment is also large correspondingly. Measurement of the Vickers hardness thereof showed a value ranging from 31 to 53.

From the foregoing, it is expected that the electrode wiring according to this embodiment has a high resistivity to stress migration for the reasons of the use of titanium nitride film, the bonding of the Al-Si-Cu alloy films to the titanium nitride films through the Ti-Al intermetallic compounds, prevention of void propagation between adjacent Al-Si-Cu alloy films by means of the intermediate titanium nitride film 106 and no void generation after heat treatment at 500° C.

Now, electromigration resistance of the embodiment will be described.

FIG. 2 shows results of experiments conducted on 20 comparative samples each formed of a single layer Al-Si-Cu alloy film 500 nm thick and on 20 of the present electrode wirings each formed by two pairs of TiN/Al-Si-Cu laminations formed on the Ti/TiN laminated film. Conditions of wiring width of 4.0 μm, current density of $5 \times 10^6$ A/cm² and ambient temperature of 242° C. were common for these experiments. There was substantially no recognizable difference therebetween before heat-treatment. However, after heat-treatment at 450° C. for 30 minutes, a substantial difference was observed therebetween. The reason for this may be that, in the present embodiment, Ti-Al intermetallic compounds are formed at the interface between the titanium nitride film and the Al-Si-Cu alloy film by which transportation of aluminum is restricted. Although resistance of Ti-Al intermetallic compounds is high, an increase thereof is 5% at most and negligible since an amount of such intermetallic compounds is very small. That is, although apparent resistivity of the present embodiment is $5 \times 10^{-6}$ ohm-cm, the resistivity of the current path is $4 \times 10^{-6}$ ohm-cm when current is assumed as flowing through the main current path formed by the Al-Si-Cu alloy film, which is very close to that of the single Al-Si-Cu alloy film. Titanium nitride does not react with Al-Cu alloy film. Ti-Al intermetallic compounds are formed by reaction of a minute amount of stoichiometrically excessive titanium in the titanium nitride film with aluminum. Furthermore, as mentioned previously, the formation of such intermetallic compounds is restricted by reaction between silicon and titanium. Thus, the increase of resistance to be caused thereby can be neglected. Therefore, it is possible to form an electrode wiring with high reproducibility.

FIG. 3 shows a result of electromigration tests conducted on a first sample group including 20 samples of electrode wirings each composed of a single Al-Si-Cu alloy film on a silicon oxide formed on a silicon substrate in which average grain diameter of aluminum is 2 μm, a second sample group including 20 samples of electrode wirings each composed of a single Al-Si-Cu alloy film on a doubled TiN/Ti layer formed on a silicon oxide film on a silicon substrate in which the thickness of the single alloy film is 500 nm and the average grain diameter of aluminum is 0.7 μm and a third sample group including 20 chips of the present embodiment in which the average grain diameter of aluminum is 0.4 μm. The width of electrode wirings were commonly W=0.25 μm. Test conditions were commonly current density of $1 \times 10^7$ A/cm² and ambient temperature of 290° C.

It was observed that all of the samples in the first and second sample groups were degraded to an unacceptable state within 2 hours, while no defect was observed in any of the present chips even after 100 hours. Under usual conditions of current density of $1 \times 10^6$ A/cm² and temperature of 250° C., the present electrode wiring can be expected to operate normally for 1000 hours or more.

In this embodiment in which the average grain size of aluminum is 0.4 μm, the Al-Si-Cu alloy films 105 and 107 shall have bamboo structures when the width of wiring is reduced to the order of 0.25 μm. Such structure is very favorable in attaining high resistance to electromigration.

The ratio of silicon and copper in the Al-Si-Cu alloy film is not limited to those values described and other values within a range usable as wiring of semiconductor device may be used.

Although the present invention has been described with reference to a specific embodiment, this description is not meant to be construed in a limiting sense. Various modifications of the disclosed embodiment, as well as other embodiments of the present invention, will become apparent to persons skilled in the art upon reference to the description of the present invention. It is, therefore, contemplated that the appended claims will cover any modifications or embodiments as fall within the true scope of the present invention.

What is claimed is:

1. A semiconductor device including an electrode wiring formed selectively on an insulating film on a silicon chip, said electrode wiring comprising an aluminum-silicon-copper alloy film and a titanium nitride film formed on said aluminum-silicon-copper alloy film.

2. The semiconductor device claimed in claim 1, wherein titanium-aluminum intermetallic compounds are formed in grain boundaries of said aluminum-silicon-copper alloy film and in an interface between said titanium nitride film and said aluminum-silicon-copper film.

3. A semiconductor device including an electrode wiring formed selectively on an insulating film on a silicon chip, said electrode wiring comprising a titanium film formed on said insulating film, a first titanium nitride film formed on said titanium film, a first aluminum-silicon-copper alloy film formed on said first titanium nitride film, a second titanium nitride film formed on said first aluminum-silicon-copper alloy film, a second aluminum-silicon-copper alloy film formed on said second titanium nitride film and a third titanium nitride film formed on said second aluminum-silicon-copper alloy.

4. The semiconductor device claimed in claim 3, wherein titanium-aluminum intermetallic compounds are formed in grain boundaries of said first and second aluminum-silicon-copper alloy films and in an interface between aluminum-silicon-copper alloy films and said titanium nitride films.

* * * * *